(12) United States Patent
Huang

(10) Patent No.: US 8,960,956 B2
(45) Date of Patent: Feb. 24, 2015

(54) LED LIGHT SOURCE AND CORRESPONDING BACKLIGHT MODULE

(75) Inventor: Jianfa Huang, Shenzhen (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 331 days.

(21) Appl. No.: 13/512,567

(22) PCT Filed: Apr. 11, 2012

(86) PCT No.: PCT/CN2012/073776
§ 371 (c)(1), (2), (4) Date: May 29, 2012

(87) PCT Pub. No.: WO2013/152480
PCT Pub. Date: Oct. 17, 2013

(65) Prior Publication Data
US 2013/0264594 A1    Oct. 10, 2013

(30) Foreign Application Priority Data
Apr. 9, 2012   (CN) .......................... 2012 1 0101503

(51) Int. Cl.
*F21V 23/00* (2006.01)
*G02F 1/1335* (2006.01)

(52) U.S. Cl.
CPC .................. *G02F 1/133603* (2013.01)
USPC ....................... 362/249.02; 257/676

(58) Field of Classification Search
CPC ............................ G02F 1/1336; H01L 33/486
USPC ............................... 257/676; 362/249.02, 612
See application file for complete search history.

(56) References Cited

U.S. PATENT DOCUMENTS

2009/0268434 A1*  10/2009  Mita et al. .................... 362/97.1
2012/0300491 A1*  11/2012  Hussell et al. ................ 362/602

* cited by examiner

*Primary Examiner* — Thomas L Dickey

(57) ABSTRACT

The present invention relates to an LED light source and a corresponding backlight module. The LED light source includes a bar-shaped base and multiple LED assemblies. The LED assemblies each has an LED leadframe, a light-emitting chip, an anode bonding pad and a cathode bonding pad. The anode and cathode bonding pads are connected to the light-emitting chip and mounted on a bottom of the LED leadframe. By mounting the electrodes of the LED assembly on the bottom of the LED leadframe, the LED light source and the corresponding backlight module of the present invention prevents a technical problem that the electrodes of LED assemblies are easy to become short-circuited.

17 Claims, 7 Drawing Sheets

LED LIGHT SOURCE AND CORRESPONDING BACKLIGHT MODULE

BACKGROUND OF THE INVENTION

1. Field of the Invention

The present invention relates to a field of liquid crystal display technology, especially to an LED light source and a corresponding backlight module that enhances the reliability and display quality of a liquid crystal display device.

2. Description of the Related Art

Liquid crystal display (LCD) devices have been widely used in various electronic products. Most of the liquid crystal display devices are backlight type liquid crystal display devices, which include a liquid crystal panel and a backlight module. The backlight modules can be divided into side-light type backlight modules and direct-light type backlight modules according to the position of their incident light source.

With reference to FIG. 1 and FIG. 2, FIG. 1 is a structural view of a conventional side-light type backlight module and FIG. 2 is a partial structural view taken along the line A-A in FIG. 1, wherein the backlight module has a light guide plate 11 and an LED light source 12. The LED light source 12 is an LED light bar which has a bar-shaped base 13 and a plurality of LED assemblies 14 mounted on the bar-shaped base 13. The LED assemblies 14 each comprises an LED leadframe 141, multiple light-emitting chips 142, multiple anode bonding pads 143 and multiple cathode bonding pads 144, wherein the light-emitting chips 142, the anode bonding pads 143 and the cathode bonding pads 144 are mounted on a top of the LED leadframe 141. With reference to FIG. 2, the anode bonding pad 143 and cathode bonding pad 144 of each one of the LED assemblies 14 both are mounted on the top of the LED leadframe 141 and are protruding out from the vertical sides of two ends of the LED leadframe 141. In order to ensure that short circuits do not occur between the adjacent LED assemblies 14, the distance between the adjacent electrodes (the anode bonding pad 143 and cathode bonding pad 144) mush be larger than 1 mm. However, in this way, the distance between the adjacent LED assemblies 14 thus is too large that the brightness of the lights generated by the LED light source 12 is not uniform along a B direction for the incident surface of the light guide plate 11. The backlight module then induces so-called hot spot mura that enormously affects the display quality of liquid crystal display device.

Hence, it is necessary to provide an LED light source and a corresponding backlight module to overcome the problems existing in the conventional technology.

SUMMARY OF THE INVENTION

An object of the present invention is to provide an LED light source and a corresponding backlight module that mount the electrodes of each LED assembly at the bottom of each LED lead-frame so as to solve the technical problem that the electrodes of the LED assemblies of the conventional LED sources are easy to become short-circuited or the corresponding backlight module are easy to induce hot spot mura.

The present invention relates to an LED light source which comprises a bar-shaped base; and multiple LED assemblies mounted on the bar-shaped base. The LED assemblies each includes an LED leadframe; a light-emitting chip mounted at a center of a top of the LED leadframe; an anode bonding pad; and a cathode bonding pad. The anode bonding pad and the cathode bonding pad are respectively connected to the light-emitting chip. The anode bonding pad and the cathode bonding pad are respectively mounted at two ends of a bottom of the LED leadframe. A distance from the anode bonding pad to a vertical side edge of a corresponding closer end of the LED leadframe is larger than 0.3 mm, and a distance from the cathode bonding pad to a vertical side edge of the other closer end of the LED leadframe is larger than 0.3 mm. The vertical side edges are both perpendicular to a length direction of the bar-shaped base. The anode bonding pad has an anode solder point protruding out from a parallel side edge of the LED leadframe. The cathode bonding pad has a cathode solder point protruding out from another parallel side edge of the LED leadframe. The parallel side edges are parallel to the length direction of the bar-shaped base.

In one embodiment of the LED light source of the present invention, the LED assemblies are LED assemblies with separated thermal and electrical structures, LED assemblies with combined thermal and electrical structures or twin LED assemblies.

The present invention relates to an LED light source which comprises a bar-shaped base; and multiple LED assemblies mounted on the bar-shaped base. The LED assemblies each comprises: an LED leadframe; a light-emitting chip mounted at a center of a top of the LED leadframe; an anode bonding pad; and a cathode bonding pad. The anode bonding pad and the cathode bonding pad are respectively connected to the light-emitting chip. The anode bonding pad and the cathode bonding pad are respectively mounted on the bottom of the LED leadframe.

In one embodiment of the LED light source of the present invention, the anode bonding pad and the cathode bonding pad are mounted at two ends of the bottom of the LED leadframe; a distance from the anode bonding pad to a vertical side edge of a corresponding closer end of the LED leadframe is larger than 0.3 mm; a distance from the cathode bonding pad to a vertical side edge of the other closer end of the LED leadframe is larger than 0.3 mm; and both the vertical side edges are perpendicular to a length direction of the bar-shaped base.

In one embodiment of the LED light source of the present invention, the anode bonding pad has an anode solder point protruding out from a parallel side edge of the LED leadframe; the cathode bonding pad includes a cathode solder point protruding out from another parallel side edge of the LED leadframe; and the parallel side edges are parallel to the length direction of the bar-shaped base.

In one embodiment of the LED light source of the present invention, the LED assemblies are LED assemblies with separated thermal and electrical structures, and each of the LED assemblies further has a heat-dissipating bonding pad used for dissipating heat of the light-emitting chip; the heat-dissipating bonding pad is mounted at a center of the bottom of the LED leadframe; and the anode bonding pad and the cathode bonding pad are mounted at two ends of the bottom of the LED leadframe.

In one embodiment of the LED light source of the present invention, the LED assemblies are LED assemblies with combined thermal and electrical structures.

In one embodiment of the LED light source of the present invention, the LED assemblies each includes: a first light-emitting chip, a second light-emitting chip, a first cathode bonding pad, a second cathode bonding pad, a first heat-dissipating bonding pad and a second heat-dissipating bonding pad; the first heat-dissipating bonding pad is used for dissipating heat of the first light-emitting chip, the second heat-dissipating bonding pad is used for dissipating heat of the second light-emitting chip; the first and the second heat-dissipating bonding pads are mounted on the bottom of the LED leadframe; the anode bonding pad is mounted at a center of the bottom of the LED leadframe; the first and the second cathode bonding pads are respectively mounted at two ends of the bottom of the LED leadframe.

In one embodiment of the LED light source of the present invention, the anode bonding pad is connected to the first light-emitting chip and the second light-emitting chip, respectively; the first cathode bonding pad is connected to the first light-emitting chip; and the second cathode bonding pad is connected to the second light-emitting chip.

In one embodiment of the LED light source of the present invention, the LED assemblies each comprises a first light-emitting chip, a second light-emitting chip and a heat-dissipating bonging pad; the heat-dissipating bonding pad is used for dissipating heat of the first light-emitting chip and the second light-emitting chip; the heat-dissipating bonding pad is mounted at a center of the bottom of the LED leadframe; and the anode bonding pad and the cathode bonding pad are mounted at two ends of the bottom of the LED leadframe.

In one embodiment of the LED light source of the present invention, the cathode bonding pad, the first light-emitting chip, the second light-emitting chip and the anode bonding chip are orderly connected in series.

The present invention further relates to a backlight module which comprises: a light guide plate; and an LED light source mounted at an incident side of the light guide plate and having: a bar-shaped base; and multiple LED assemblies mounted on the bar-shaped base. The LED assemblies each includes: an LED leadframe; a light-emitting chip mounted at a center of a top of the LED leadframe; an anode bonding pad; and a cathode bonding pad. The anode bonding pad and the cathode bonding pad are respectively connected to the light-emitting chip. The anode bonding pad and the cathode bonding pad are mounted on a bottom of the LED leadframe, respectively.

In one embodiment of the backlight module of the present invention, the anode bonding pad and the cathode bonding pad are respectively mounted at two ends of the bottom of the LED leadframe; a distance from the anode bonding pad to a vertical side edge of a corresponding closer end of the LED leadframe is larger than 0.3 mm; a distance from the cathode bonding pad to a vertical side edge of the other closer end of the LED leadframe is larger than 0.3 mm; and the vertical side edges are both perpendicular to a length direction of the bar-shaped base.

In one embodiment of the backlight module of the present invention, the anode bonding pad has an anode solder point protruding out from a parallel side edge of the LED leadframe; the cathode bonding pad has a cathode solder point protruding out from another parallel side edge of the LED leadframe; and the parallel side edges are parallel to the length direction of the bar-shaped base.

In one embodiment of the backlight module of the present invention, the LED assemblies are LED assemblies with separated thermal and electrical structures, and each of the LED assemblies further has a heat-dissipating bonding pad used for dissipating heat of the light-emitting chip; the heat-dissipating bonding pad is mounted at a center of the bottom of the LED leadframe; and the anode bonding pad and the cathode bonding pad are mounted at two ends of the bottom of the LED leadframe.

In one embodiment of the backlight module of the present invention, the LED assemblies are LED assemblies with combined thermal and electrical structures.

In one embodiment of the backlight module of the present invention, the LED assemblies each includes: a first light-emitting chip, a second light-emitting chip, a first cathode bonding pad, a second cathode bonding pad, a first heat-dissipating bonding pad and a second heat-dissipating bonding pad; the first heat-dissipating bonding pad is used for dissipating heat of the first light-emitting chip, the second heat-dissipating bonding pad is used for dissipating heat of the second light-emitting chip; the first and the second heat-dissipating bonding pads are mounted on the bottom of the LED leadframe; the anode bonding pad is mounted at a center of the bottom of the LED leadframe; the first and the second cathode bonding pads are respectively mounted at the two ends of the bottom of the LED leadframe.

In one embodiment of the backlight module of the present invention, the anode bonding pad is connected to the first light-emitting chip and the second light-emitting chip, respectively; the first cathode bonding pad is connected to the first light-emitting chip; and the second cathode bonding pad is connected to the second light-emitting chip.

In one embodiment of the backlight module of the present invention, the LED assemblies each comprises a first light-emitting chip, a second light-emitting chip and a heat-dissipating bonging pad; the heat-dissipating bonding pad is used for dissipating heat of the first light-emitting chip and the second light-emitting chip; the heat-dissipating bonding pad is mounted at a center of the bottom of the LED leadframe; and the anode bonding pad and the cathode bonding pad are mounted at two ends of the bottom of the LED frame.

In one embodiment of the backlight module of the present invention, the cathode bonding pad, the first light-emitting chip, the second light-emitting chip and the anode bonding chip are orderly connected in series.

Practicing the LED light source and the corresponding backlight module of the present invention provides following advantages:

mounting the electrodes of each of the LED assemblies on the bottom of the LED leadframe help increasing the distance between the adjacent electrodes of the adjacent LED assemblies while the distance between the adjacent LED assemblies remains the same as in prior art, and thereby solve the technical problem that the electrodes of the LED assemblies of the conventional LED sources are easy to become short-circuited or the corresponding backlight module are easy to induce hot spot mura.

In order to make the contents of the present invention to be more easily understood, the preferred embodiments of the present invention are described in detail in cooperation with accompanying drawings as follows:

DETAILED DESCRIPTION OF THE PREFERRED EMBODIMENTS

Figure 1:
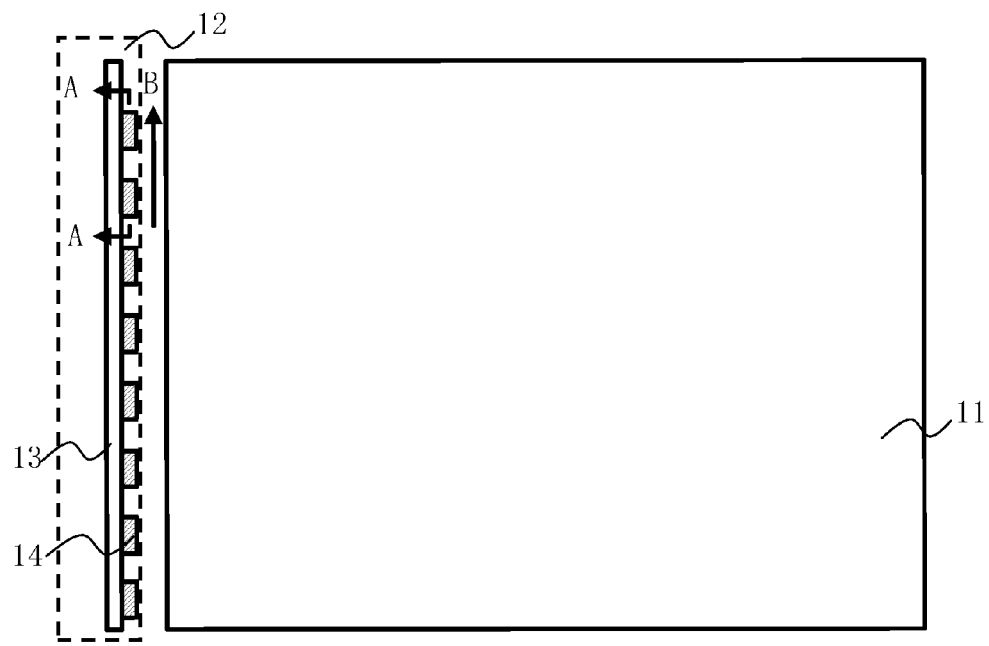
FIG. 1 is a schematic view of a conventional side-light type backlight module.

Following description of each embodiment is referring to the accompanying drawings so as to illustrate practicable specific embodiments in accordance with the present invention. The directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

In the drawings, units with similar structure are labeled with the same reference number.

Several preferred embodiments as described below explain the specific structure and operating theory of an LED light source in accordance with the present invention.

Figure 3:
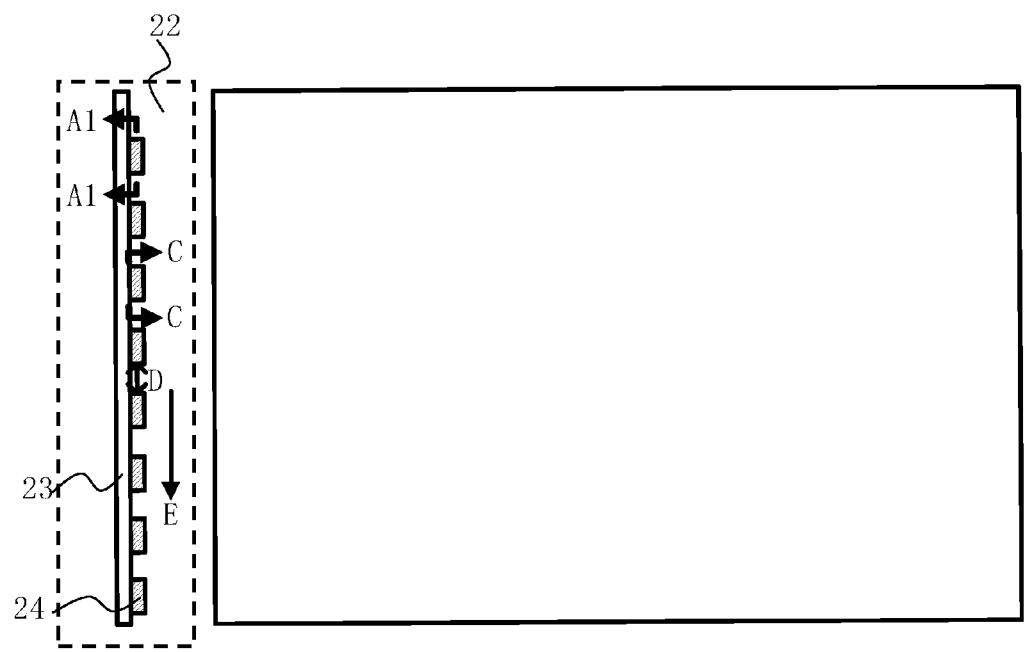
FIG. 3 is a schematic view of a preferred embodiment of a backlight module in accordance with the present invention.
Figure 4A:
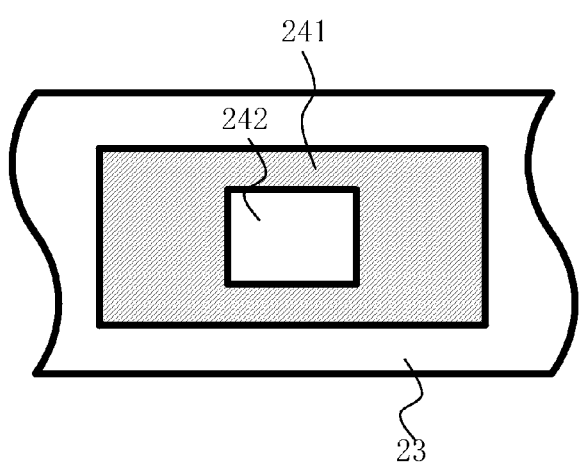
FIG. 4A is a schematic view taken along the line A1-A1 in FIG. 3, showing a first embodiment and a second embodiment of an LED light source of the present invention.
Figure 4B:
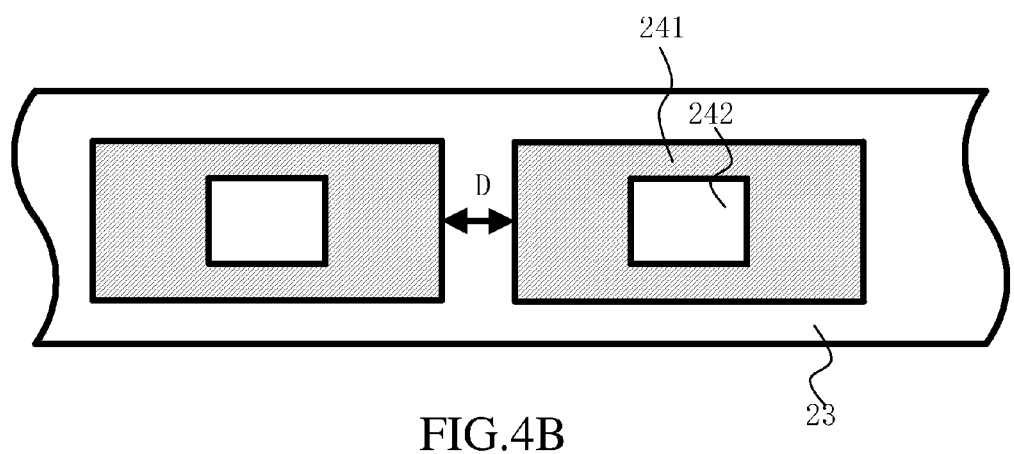
FIG. 4B is a schematic view taken along the line A-A in FIG. 1, showing a preferred embodiment of the LED light source of the present invention.
Figure 5A:
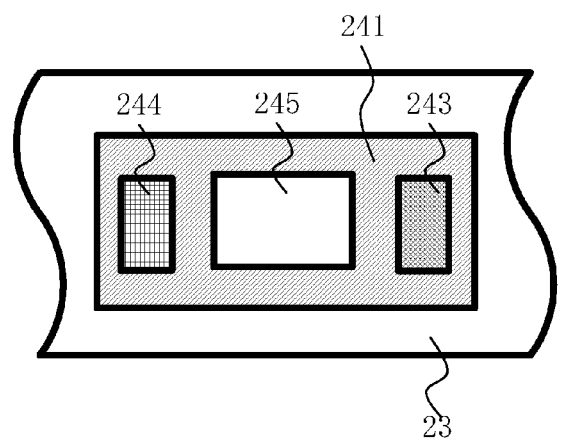
FIG. 5A is a schematic view taken along the line C-C in FIG. 3, showing the first embodiment of the LED light source of the present invention.

Please refer to FIGS. 3, 4A, 4B and 5A, wherein FIG. 3 is a schematic view of a preferred embodiment of a backlight module in accordance with the present invention; FIG. 4A is a schematic view taken along the line A1-A1 in FIG. 3, showing a first embodiment of an LED light source of the present invention (that is, a top view of an LED assembly); FIG. 4B is a schematic view taken along the line A-A in FIG. 1, showing a preferred embodiment of the LED light source of the present invention; FIG. 5A is a schematic view taken along the line C-C in FIG. 3, showing the first embodiment of the LED light source of the present invention (that is, a bottom view of the LED assembly). In this embodiment, the backlight module shown in FIG. 3 has an LED light source 22. The LED light source 22 comprises a bar-shaped base 23 and multiple LED assemblies 24, as shown in FIG. 3 and FIG. 4A, the LED assemblies 24 are arranged in series, wherein each of the two (left and right) ends (between two vertical side edges of the LED assembly 24) of each of the LED assemblies 24 is at a safe distance D from the adjacent end of the adjacent LED assembly to avoid short-circuiting. In the first preferred embodiment of the LED light source of the present invention, the LED assemblies 24 of the LED light source 22 are LED assemblies with separated thermal and electrical structures. Each of the LED assemblies 24 comprises an LED leadframe 241, an anode bonding pad 243, a cathode bonding pad 244, a light-emitting chip 242 and a heat-dissipating bonding pad 245. The anode bonding pad 243 and the cathode bonding pad 244 are respectively connected to the light-emitting chip 242. The heat-dissipating bonding pad 245 is used for dissipating heat of the light-emitting chip 242. In this embodiment, the anode bonding pad 243 and the cathode bonding pad 244 are respectively mounted at the two ends (left and right ends) of a bottom (that is, the surface of the LED leadframe 241 which faces the bar-shaped base 23) of the LED leadframe 241. The heat-dissipating bonding pad 245 is mounted at a center (that is, a position right under the light-emitting chip 242) of the bottom of the LED leadframe 241. A distance from the anode bonding pad 243 to a vertical side edge of a corresponding closer end (that is, the right end) of the LED leadframe 241 is larger than 0.3 mm. A distance from the cathode bonding pad 244 to a vertical side edge of the other closer end (that is, the left end) of the LED leadframe 241 is also larger than 0.3 mm. The vertical side edges of the LED leadframe 241 means the side edges that are substantially perpendicular to a length direction of the bar-shaped base 23, wherein the length direction of the bar-shaped base 23 means an extension direction E of the longer side of the bar-shaped base 23.

Figure 2:
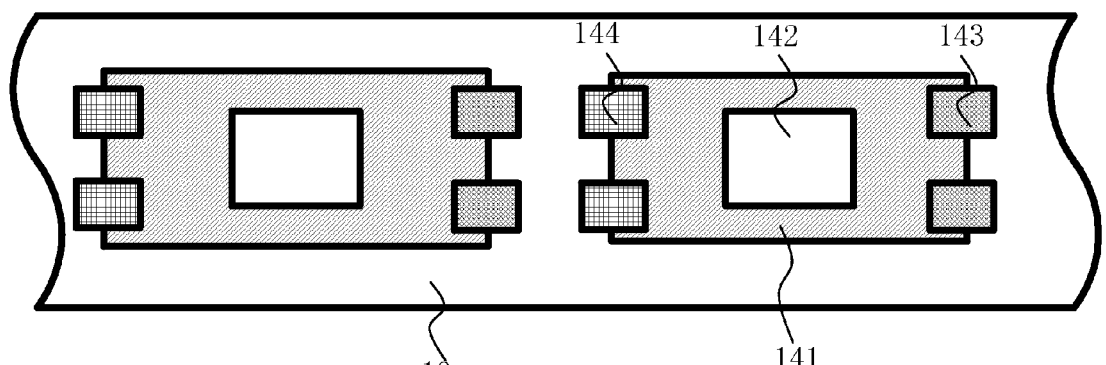
FIG. 2 is a schematic view taken along the line A-A in FIG. 1, showing a part of an LED light source.

When using the LED light source 22 of this embodiment, comparing with the conventional technology in FIG. 2, the anode bonding pad 243 and the cathode bonding pad 233 are not mounted on the top of the LED leadframe 241 of the LED assembly 24 of this embodiment, therefore the distance between the adjacent LED leadframes 241 can be appropriately reduce, which means the safe distance D between the adjacent LED assemblies 24 can be reduce, such that the brightness of the LED light source 22 can be more even to avoid hot spot mura phenomenon. At the same time, since the anode bonding pad 243 and the cathode bonding pad 244 are mounted at the two ends of the bottom of the LED leadframe 241, the anode bonding pad 243 and the cathode bonding pad 244 have sufficient position-adjusting room (for example, the distance from the anode bonding pad 243 to the vertical side edge of the closer end (the right end) of the LED leadframe 241 is larger than 0.3 mm, and the distance from the cathode bonding pad 244 to the vertical edge of the other closer end (the left end) of the LED leadframe 241 is also larger than 0.3 mm) to ensure that short-circuiting does not occur between the electrodes of the adjacent LED assemblies 24.

Figure 5B:
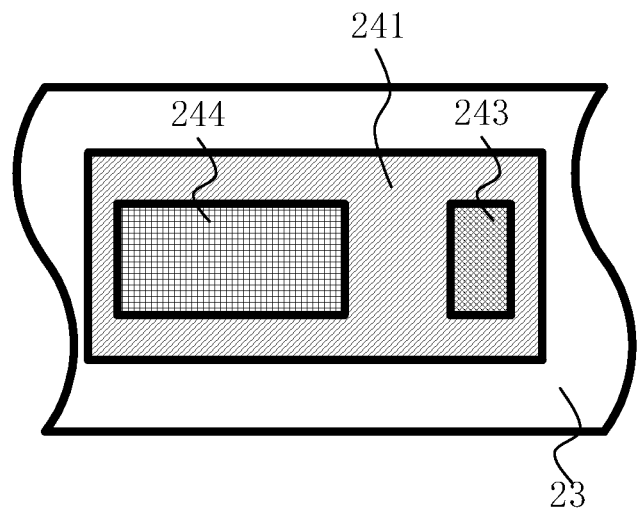
FIG. 5B is a schematic view taken along the line C-C in FIG. 3, showing the second embodiment of the LED light source of the present invention.

Please refer to FIG. 3, FIG. 4A and FIG. 5B, wherein FIG. 4A, which is taken along the line A1-A1 in FIG. 3, is also the schematic view of a second embodiment of the LED light source of the present invention and FIG. 5B is a schematic view taken along the line C-C in FIG. 3, showing the second embodiment of the LED light source of the present invention. This embodiment differs from the first embodiment in that: the LED assembly 24 is an LED assembly with combined thermal and electrical structure. The LED assembly 24 includes an LED leadframe 241, a light-emitting chip 242, an anode bonding pad 243 and a cathode bonding pad 244. In this embodiment, the anode 243 and the cathode bonding pad 244 are mounted at the two ends of the bottom of the LED leadframe 241, but the cathode bonding pad 244 further has a function for dissipating the heat of the light-emitting chip 242, therefore the cathode bonding pad 244 is designed to have a larger area so as to enhance fast heat-dissipation for the light-emitting chip 242. In this embodiment, the LED assembly does not require an additional single heat-dissipating bonding pad, it can perform heat-dissipation via the cathode bonding pad 244.

Using the LED light source 22 of this embodiment can also provide the same effects as the first embodiment does to avoid hot spot mura phenomenon and ensure short-circuiting not occurring between adjacent LED assemblies 24.

Figure 6:
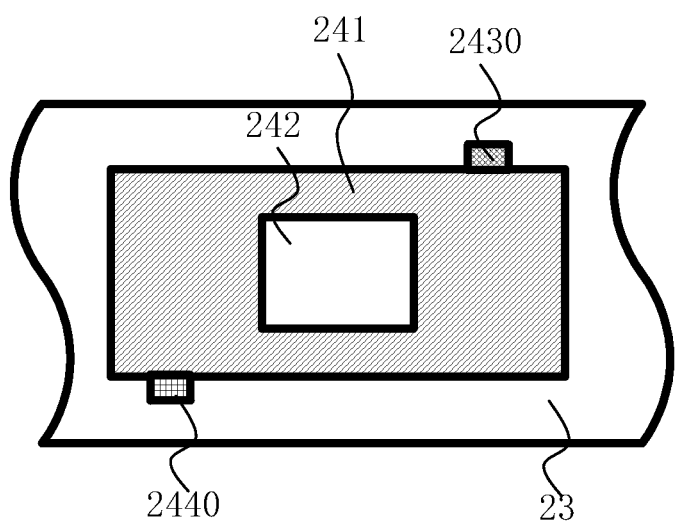
FIG. 6 is a schematic view taken along the line A1-A1 in FIG. 3, showing a third embodiment and a fourth embodiment of the LED light source of the present invention.
Figure 7A:
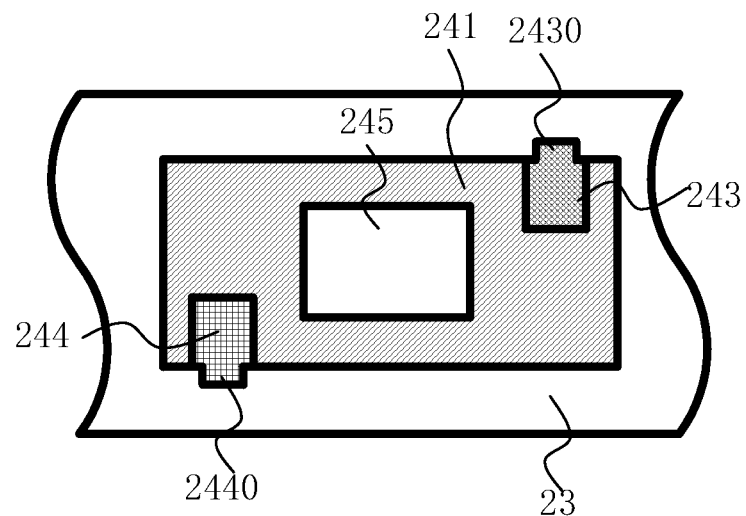
FIG. 7A is a schematic view taken along the line C-C in FIG. 3, showing the third embodiment of the LED light source of the present invention.

Please refer to FIG. 3, FIG. 6 and FIG. 7A, wherein FIG. 6 is a schematic view taken along the line A1-A1 in FIG. 3, showing a third embodiment of the LED light source of the present invention, and FIG. 7A is a schematic view taken along the line C-C in FIG. 3, showing the third embodiment of the LED light source of the present invention. This embodiment differs from the first embodiment in that: the anode bonding pad 243 has an anode solder point 2430 protruding out from a parallel side edge (that is, the upper side edge in the figure) of the LED leadframe 241. The cathode bonding pad 244 has a cathode solder point 2440 protruding out from another parallel side edge (that is, the lower side edge in the figure) of the LED leadframe 241. The LED assembly 24 of the LED light source 22 of this embodiment is an LED assembly with separated thermal and electrical structure, hence the LED assembly 24 includes an LED leadframe 241, a light-emitting chip 242, an anode bonding pad 243, a cathode bonding pad 244 and a heat-dissipating bonding pad 245. The parallel side edges mean the side edges that are substantially parallel to the length direction of the bar-shaped base 23. In this embodiment, the anode bonding pad 243 and the cathode bonding pad 244 are also mounted at the two ends of the bottom of the LED leadframe 241, respectively, and the heat-dissipating bonding pad 245 is mounted at a center of the bottom of the LED leadframe 241. But the anode bonding pad 243 is connected to a connecting point of the bar-shaped base 23 (such as a printed circuit board) via the anode solder point 2430; and the cathode bonding pad 244 is connected to a connecting point of the bar-shaped base 23 (such as a printed circuit board) via the cathode solder point 2440.

Using the LED light source 22 of this embodiment can also provide the same effects as the first embodiment does to avoid hot spot mura phenomenon and ensure short-circuiting not occurring between adjacent LED assemblies 24. At the same time, since the anode solder point 2430 and the cathode solder point 2440 are mounted at the parallel side edges of the LED leadframe 241, the anode bonding pad 243 and the cathode bonding pad 244 can be easily connected to the connecting points of the bar-shaped base 23 by soldering. The anode solder point 2430 and the cathode solder point 2440 can protrude out from any parallel side edge of the LED leadframe 241 according to different needs; hence the protruding directions of the anode solder point 2430 and the cathode solder point 2440 do not limit the present invention.

Figure 7B:
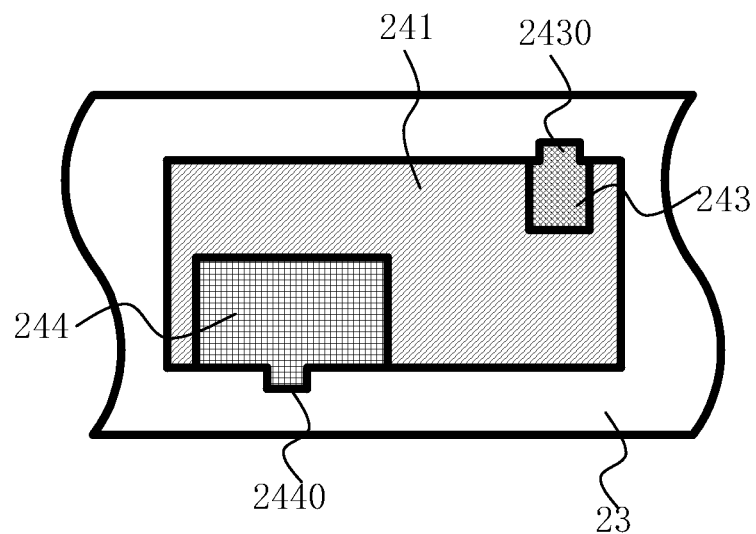
FIG. 7B is a schematic view taken along the line C-C in FIG. 3, showing the fourth embodiment of the LED light source of the present invention.

Please refer to FIG. 3, FIG. 6 and FIG. 7B, wherein FIG. 6, which is taken along the line A1-A1 in FIG. 3, is also the schematic view of a fourth embodiment of the LED light source of the present invention and FIG. 7B is a schematic view taken along the line C-C in FIG. 3, showing the fourth embodiment of the LED light source of the present invention. This embodiment differs from the third embodiment in that: the LED assembly 24 is an LED assembly with a combined thermal and electrical structure. The LED assembly 24 includes an LED leadframe 241, a light-emitting chip 242, an anode bonding pad 243 and a cathode bonding pad 244. In this embodiment, the anode bonding pad 243 and the cathode bonding pad 244 are also mounted at the two ends of the bottom of the LED leadframe 241, but the cathode bonding pad 244 further has a function for dissipating the heat of the light-emitting chip 242, therefore the cathode bonding pad 244 is designed to have a larger area so as to enhance fast heat-dissipation for the light-emitting chip 242. In this embodiment, the LED assembly does not require an additional single heat-dissipating bonding pad, it can perform heat-dissipation via the cathode bonding pad 244.

Using the LED light source 22 of this embodiment can also provide the same effects as the third embodiment does to avoid hot spot mura phenomenon and ensure short-circuiting not occurring between adjacent LED assemblies 24. At the same time, since the anode solder point 2430 and the cathode solder point 2440 are mounted at the parallel side edges of the LED leadframe 241, the anode bonding pad 243 and the cathode bonding pad 244 can be easily connected to the connecting points of the bar-shaped base 23 by soldering.

Figure 8:
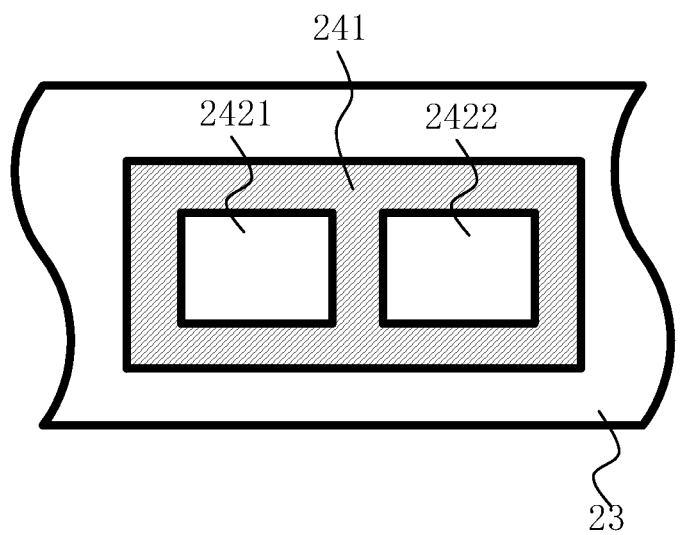
FIG. 8 is a schematic view taken along the line A1-A1 in FIG. 3, showing a fifth embodiment and a sixth embodiment of the LED light source of the present invention.
Figure 9A:
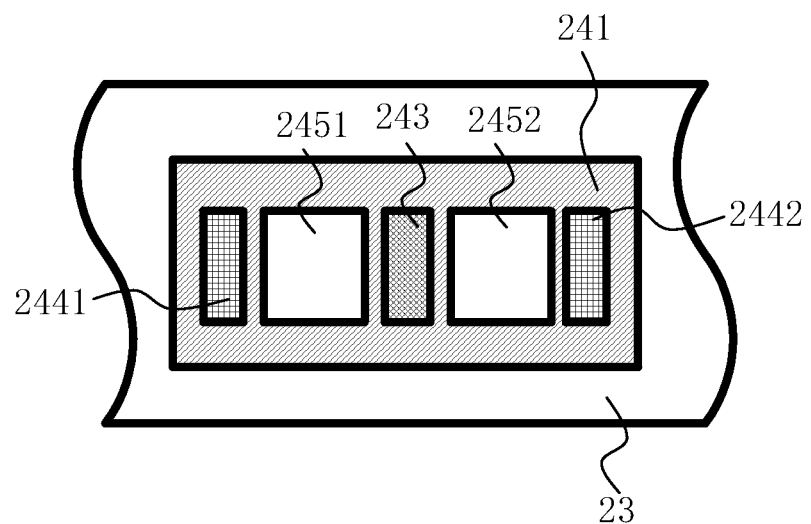
FIG. 9A is a schematic view taken along the line C-C in FIG. 3, showing the fifth embodiment of the LED light source of the present invention.

Please refer to FIG. 3, FIG. 8 and FIG. 9A, wherein FIG. 8 is a schematic view taken along the line A1-A1 in FIG. 3, showing a fifth embodiment of the LED light source of the present invention, and FIG. 9A is a schematic view taken along the line C-C in FIG. 3, showing the fifth embodiment of the LED light source of the present invention. In this embodiment, the LED assembly 24 is a twin LED assembly. The LED assembly 24 includes an LED leadframe 241, a first light-emitting chip 2421, a second light-emitting chip 2422, a first cathode bonding pad 2441, a second cathode bonding pad 2442, an anode bonding pad 243, a first heat-dissipating bonding pad 2451 and a second heat-dissipating bonding pad 2452. The anode bonding pad 243 is connected to the first light-emitting chip 2421 and the second light-emitting chip 2422, respectively. The first cathode bonding pad 2441 is connected to the first light-emitting chip 2421. The second cathode bonding pad 2442 is connected to the second light-emitting chip 2422 (that is, the first light-emitting chip 2421 and the second light-emitting chip are connected in parallel). The first heat-dissipating bonding pad 2451 is mounted on the bottom of the LED leadframe 241 under the first light-emitting chip 2421 to dissipate heat of the first light-emitting chip 2421; and the second heat-dissipating bonding pad 2452 is mounted on the bottom of the LED leadframe 241 under the second light-emitting chip 2422 to dissipate heat of the second light-emitting chip 2422. The anode bonding pad 243 is mounted at the center of the bottom of the LED leadframe 241; the first cathode bonding pad 2441 and the second cathode bonding pad 2442 are mounted at the two ends of the bottom of the LED leadframe 241 (the first cathode bonding pad 2441 is close to the first heat-dissipating bonding pad 2451; the second cathode bonding pad 2442 is close to the second heat-dissipating bonding pad 2452). A distance from the first cathode bonding pad 2441 to a vertical side edge of a closer end (left end) of the LED leadframe 241 is larger than 0.3 mm, and a distance from the second cathode bonding pad 2442 to a vertical side edge of the other end (right end) of the LED leadframe 241 is also larger than 0.3 mm.

Using the LED light source 22 of this embodiment can also provide the same effects as the first embodiment does to avoid hot spot mura phenomenon and ensure short-circuiting not occurring between adjacent LED assemblies 24. At the same time, in consideration of the specific structure of the twin LED assembly (having two parallel connected light-emitting chips), the LED assembly has two cathode bonding pads and an anode bonding pad (or two anode bonding pads and one cathode bonding pad) so as to ensure the power supply for both of the light-emitting chips.

Figure 9B:
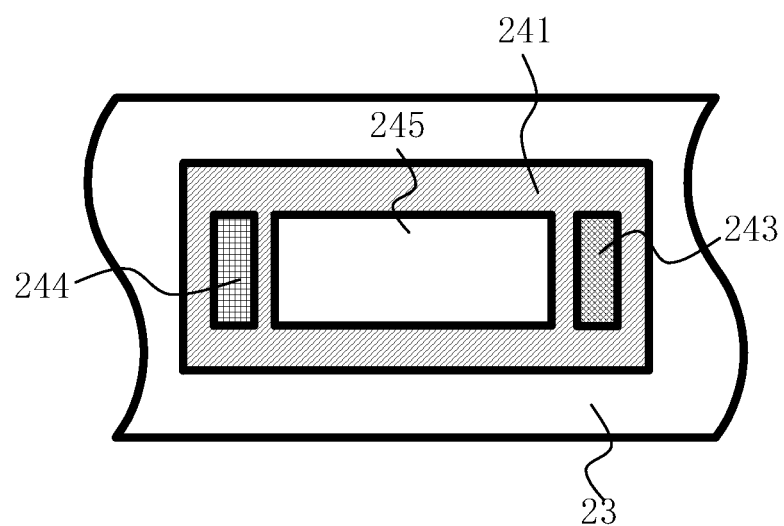
FIG. 9B is a schematic view taken along the line C-C in FIG. 3, showing the sixth embodiment of the LED light source of the present invention.

Please refer to FIG. 3, FIG. 8 and FIG. 9B, wherein FIG. 8, which is taken along the line A1-A1 in FIG. 3, is also the schematic view of a sixth embodiment of the LED light source of the present invention and FIG. 9B is a schematic view taken along the line C-C in FIG. 3, showing the sixth embodiment of the LED light source of the present invention. In this embodiment, the LED assembly 24 is also a twin LED assembly. The LED assembly 24 includes a first light-emitting chip 2421, a second light-emitting chip 2422, a cathode bonding pad 244, an anode bonding pad 243 and a heat-dissipating bonding pad 245. The cathode bonding pad 244, the first light-emitting chip 2421, the second light-emitting chip 2422 and the anode bonding pad 243 are orderly connected in series (that is, the first light-emitting chip 2421 and the second light-emitting chip 2422 are connected in series). The heat-dissipating bonding pad 245 is mounted at the center of the bottom of the LED leadframe 241 under the first light-emitting chip 2421 and the second light-emitting chip 2422 to dissipate heat of the first light-emitting chip 2421 and the second light-emitting chip 2422. The anode bonding pad 243 and the cathode bonding pad 244 are respectively mounted at the two ends of the bottom of the LED lead frame 241.

Using the LED light source 22 of this embodiment can also provide the same effects as the first embodiment does to avoid hot spot mura phenomenon and ensure short-circuiting not occurring between adjacent LED assemblies 24. At the same time, in consideration of the specific structure of the twin LED assembly (having two serial-connected light-emitting chips), the anode bonding pad 243 and the cathode bonding pad 244 are respectively mounted at two sides of the light-emitting chips on the bottom of the leadframe so as to ensure the power supply for both of the light-emitting chips.

The LED light source 22 is not limited on using twin LED assembly. Using a multi-chip LED assembly is also available. A user can decide the number of the anode bonding pad and the cathode bonding pad and the positions of the anode bonding pad and the cathode bonding pad at the bottom of the LED leadframe 241 according to the number and structure of the light-emitting chip in the LED assembly. Such an LED light source can also avoid hot spot mura phenomenon and ensure short-circuiting not occurring between adjacent LED assemblies.

The present invention further relates to a backlight module, wherein the backlight module includes a light guide plate and an LED light source mounted at an incident side of the light guide plate. The LED light source includes a bar-shaped base (such as a printed circuit board) and multiple LED assemblies mounted on the bar-shaped base. The assembly comprises an LED leadframe, a light-emitting chip mounted at a center of a top of the LED leadframe, an anode bonding pad and a cathode bonding pad. The anode bonding pad and the cathode bonding pad are connected to the light-emitting chip. The anode bonding pad and the cathode bonding pad of the LED assembly are mounted on a bottom of the LED leadframe. The working theory and advantages of the backlight module of the present invention is the same as the above-mentioned LED specific embodiments of the light source, therefore please refer to the foregoing embodiments for understanding the specific structure of the backlight module.

By the above description, it is known that the present invention mounts the electrodes of each of the LED assemblies on the bottom of the LED leadframe so as to help increasing the distance between the adjacent electrodes of the adjacent LED assemblies while the distance between the adjacent LED assemblies remains the same as in prior art, and thereby solve the technical problem that the electrodes of the LED assemblies of the conventional LED sources are easy to become short-circuited or the corresponding backlight module are easy to induce hot spot mura.

The present invention has been described with a preferred embodiment thereof and it is understood that many changes and modifications to the described embodiment can be carried out without departing from the scope and the spirit of the invention that is intended to be limited only by the appended claims.

What is claimed is:
1. An LED light source comprising:
   a bar-shaped base; and
   multiple LED assemblies mounted on the bar-shaped base, wherein each of the LED assemblies includes:
   an LED leadframe;
   a light-emitting chip mounted at a center of a top of the LED leadframe;
   an anode bonding pad; and
   a cathode bonding pad, wherein
   the anode bonding pad and the cathode bonding pad are respectively connected to the light-emitting chip; the anode bonding pad and the cathode bonding pad are respectively mounted at two ends of a bottom of the LED leadframe; a distance from the anode bonding pad to a vertical side edge of a coresponding closer end of the LED leadframe is larger than 0.3 mm, and a distance from the cathode bonding pad to a vertical side edge of the other closer end of the LED leadframe is larger than 0.3 mm; and the vertical side edges are both perpendicular to a length direction of the bar-shaped base; and
   the anode bonding pad has an anode solder point protruding out from a parallel side edge of the LED leadframe; the cathode bonding pad has a cathode solder point protruding out from another parallel side edge of the LED leadframe; and the parallel side edges are parallel to the length direction of the bar-shaped base.

2. The LED light source as claimed in claim 1, wherein the LED assemblies are LED assemblies with separated thermal and electrical structures, LED assemblies with combined thermal and electrical structures or twin LED assemblies.

3. An LED light source comprising:
   a bar-shaped base; and
   multiple LED assemblies mounted on the bar-shaped base, wherein each of the LED assemblies includes:
   an LED leadframe;
   a light-emitting chip mounted at a center of a top of the LED leadframe;
   an anode bonding pad; and
   a cathode bonding pad, wherein
   the anode bonding pad and the cathode bonding pad are respectively connected to the light-emitting chip; the anode bonding pad and the cathode bonding pad are respectively mounted on a bottom of the LED leadframe; wherein the anode bonding pad and the cathode bonding pad are mounted at two ends of the bottom of the LED leadframe; a distance from the anode bonding pad to a vertical side edge of a corresponding closer end of the LED leadframe is larger than 0.3 mm; a distance from the cathode bonding pad to a vertical side edge of the other closer end of the LED leadframe is larger than 0.3 mm; and both the vertical side edges are perpendicular to a length direction of the bar-shaped base.

4. The LED light source as claimed in claim 3, wherein the LED assemblies are LED assemblies with separated thermal and electrical structures, and each of the LED assemblies further has:
   a heat-dissipating bonding pad used for dissipating heat of the light-emitting chip; the heat-dissipating bonding pad is mounted at a center of the bottom of the LED leadframe; and the anode bonding pad and the cathode bonding pad are mounted at two ends of the bottom of the LED leadframe.

5. The LED light source as claimed in claim 3, wherein the LED assemblies are LED assemblies with combined thermal and electrical structures.

6. The LED light source as claimed in claim 3, wherein the LED assemblies each includes: a first light-emitting chip, a second light-emitting chip, a first cathode bonding pad, a second cathode bonding pad, a first heat-dissipating bonding pad and a second heat-dissipating bonding pad; the first heat-dissipating bonding pad is used for dissipating heat of the first light-emitting chip, the second heat-dissipating bonding pad is used for dissipating heat of the second light-emitting chip; the first and the second heat-dissipating bonding pads are mounted on the bottom of the LED leadframe; the anode bonding pad is mounted at a center of the bottom of the LED leadframe; the first and the second cathode bonding pads are respectively mounted at two ends of the bottom of the LED leadframe.

7. The LED light source as claimed in claim 6, wherein the anode bonding pad is connected to the first light-emitting chip and the second light-emitting chip, respectively; the first cathode bonding pad is connected to the first light-emitting chip; and the second cathode bonding pad is connected to the second light-emitting chip.

8. The LED light source as claimed in claim 3, wherein the LED assemblies each comprises: a first light-emitting chip, a second light-emitting chip and a heat-dissipating bonging pad; the heat-dissipating bonding pad is used for dissipating heat of the first light-emitting chip and the second light-emitting chip; the heat-dissipating bonding pad is mounted at a center of the bottom of the LED leadframe; and the anode bonding pad and the cathode bonding pad are mounted at two ends of the bottom of the LED leadframe.

9. The LED light source as claimed in claim 8, wherein the cathode bonding pad, the first light-emitting chip, the second light-emitting chip and the anode bonding chip are orderly connected in series.

10. A backlight module comprising:
a light guide plate; and
an LED light source mounted at an incident side of the light guide plate and having:
a bar-shaped base; and
multiple LED assemblies mounted on the bar-shaped base, wherein the LED assemblies each includes:
an LED leadframe;
a light-emitting chip mounted at a center of a top of the LED leadframe;
an anode bonding pad; and
a cathode bonding pad, wherein the anode bonding pad and the cathode bonding pad are respectively connected to the light-emitting chip; and the anode bonding pad and the cathode bonding pad are mounted on a bottom of the LED leadframe, respectively; wherein the anode bonding pad and the cathode bonding pad are respectively mounted at two ends of the bottom of the LED leadframe; a distance from the anode bonding pad to a vertical side edge of a corresponding closer end of the LED leadframe is larger than 0.3 mm; a distance from the cathode bonding pad to a vertical side edge of the other closer end of the LED leadframe is larger than 0.3 mm; and the vertical side edges are both perpendicular to a length direction of the bar-shaped base.

11. The backlight module as claimed in claim 10, wherein the anode bonding pad has an anode solder point protruding out from a parallel side edge of the LED leadframe; the cathode bonding pad has a cathode solder point protruding out from another parallel side edge of the LED leadframe; and the parallel side edges are parallel to a length direction of the bar-shaped base.

12. The backlight module as claimed in claim 10, wherein the LED assemblies are LED assemblies with separated thermal and electrical structures, and each of the LED assemblies further has:
a heat-dissipating bonding pad used for dissipating heat of the light-emitting chip; and
the heat-dissipating bonding pad is mounted at a center of the bottom of the LED leadframe; and the anode bonding pad and the cathode bonding pad are mounted at two ends of the bottom of the LED leadframe.

13. The backlight module as claimed in claim 10, wherein the LED assemblies are LED assemblies with combined thermal and electrical structures.

14. The backlight module as claimed in claim 10, wherein the LED assemblies each includes: a first light-emitting chip, a second light-emitting chip, a first cathode bonding pad, a second cathode bonding pad, a first heat-dissipating bonding pad and a second heat-dissipating bonding pad; the first heat-dissipating bonding pad is used for dissipating heat of the first light-emitting chip, the second heat-dissipating bonding pad is used for dissipating heat of the second light-emitting chip; the first and the second heat-dissipating bonding pads are mounted on the bottom of the LED leadframe; the anode bonding pad is mounted at a center of the bottom of the LED leadframe; the first and the second cathode bonding pads are respectively mounted at two ends of the bottom of the LED leadframe.

15. The backlight module as claimed in claim 14, wherein the anode bonding pad is connected to the first light-emitting chip and the second light-emitting chip, respectively; the first cathode bonding pad is connected to the first light-emitting chip; and the second cathode bonding pad is connected to the second light-emitting chip.

16. The backlight module as claimed in claim 10, wherein the LED assemblies each comprises a first light-emitting chip, a second light-emitting chip and a heat-dissipating bonging pad; the heat-dissipating bonding pad is used for dissipating heat of the first light-emitting chip and the second light-emitting chip; the heat-dissipating bonding pad is mounted at a center of the bottom of the LED leadframe; and the anode bonding pad and the cathode bonding pad are mounted at two ends of the bottom of the LED frame.

17. The backlight module as claimed in claim 16, wherein the cathode bonding pad, the first light-emitting chip, the second light-emitting chip and the anode bonding chip are orderly connected in series.

\* \* \* \* \*